(12) United States Patent
Kuwabara

(10) Patent No.: US 6,512,843 B1
(45) Date of Patent: Jan. 28, 2003

(54) PATTERN COMPARISON METHOD AND APPEARANCE INSPECTION MACHINE FOR PERFORMANCE COMPARISON BASED ON DOUBLE DETECTION WITHOUT DELAY

(75) Inventor: Masayuki Kuwabara, Machida (JP)

(73) Assignee: Tokyo Seimitsu Co., Ltd., Tokyo (JP)

( * ) Notice: Subject to any disclaimer, the term of this patent is extended or adjusted under 35 U.S.C. 154(b) by 0 days.

(21) Appl. No.: 09/383,151

(22) Filed: Aug. 25, 1999

(30) Foreign Application Priority Data

Oct. 28, 1998 (JP) .......................................... 10-307153

(51) Int. Cl.$^7$ ................................................ G06K 9/00
(52) U.S. Cl. ...................................................... 382/149
(58) Field of Search ................................ 382/145, 149; 348/87; 438/16; 700/110, 121

(56) References Cited

U.S. PATENT DOCUMENTS

| 4,247,203 A | * | 1/1981 | Levy et al. | .................. 356/398 |
| 4,532,650 A | * | 7/1985 | Wihl et al. | .................. 382/144 |
| 4,845,558 A | * | 7/1989 | Tsai et al. | .................. 382/145 |
| 5,699,447 A | * | 12/1997 | Alumot et al. | .............. 382/145 |
| 5,985,497 A | * | 11/1999 | Phan et al. | .................. 382/149 |
| 6,360,005 B1 | * | 3/2002 | Aloni et al. | ................. 382/149 |
| 6,363,166 B1 | * | 3/2002 | Wihl et al. | .................... 382/145 |

FOREIGN PATENT DOCUMENTS

| JP | 2-210249 | 8/1990 |
| JP | 10-145806 | 5/1998 |

* cited by examiner

*Primary Examiner*—Jon Chang
(74) *Attorney, Agent, or Firm*—Christie, Parker & Hale, LLP

(57) ABSTRACT

In a pattern comparison system based on double detection, images of areas in a plurality of identical patterns arrayed in rows and columns on an inspected object are each compared with images of two or more nearby areas. Defects are detected based on the results of comparison. The pattern comparison system includes a scanning unit, a storage unit, and a comparison unit. The scanning unit relatively scans the inspected object in a combination of positive and negative directions along the rows or columns so as to produce images of areas on the inspected objects. The produced images of areas are temporarily stored in the storage unit. The comparison unit compares a produced image of each area with the other stored images of two or more nearby areas which have been produced by scanning dice in the same direction.

6 Claims, 4 Drawing Sheets

Fig. 4

| IMAGE ACQUISITION UNIT | | IMAGE COMPARISON UNIT | IMAGE STORAGE UNIT | | | | |
|---|---|---|---|---|---|---|---|
| SCANNING DIRECTION (X-AXIS DIRECTION) | IMAGE-ACQUIRED AREA | PAIR OF IMAGES TO BE COMPARED | MEMORY | | | | |
| | | | 1 | 2 | 3 | 4 | 5 |
| POSITIVE | 1-1 | NONE  NONE | 1-1 | | | | |
| | 2-1 | 2-1  1-1 | (1-1) | (2-1) | | | |
| | 3-1 | 3-1  (2-1) | (1-1) | [2-1] | (3-1) | | |
| NEGATIVE | 3-2 | NONE  NONE | (1-1) | | (3-1) | 3-2 | |
| | 2-2 | 2-2  3-2 | (1-1) | (2-2) | (3-1) | (3-2) | |
| | 1-2 | 1-2  (2-2) | (1-1) | [2-2] | (3-1) | (3-2) | (1-2) |
| POSITIVE | 1-3 | 1-3  (1-1) | [1-1] | (1-3) | (3-1) | (3-2) | (1-2) |
| | 2-3 | 2-3  (1-3) | (2-3) | [1-3] | (3-1) | (3-2) | (1-2) |
| | 3-3 | 3-3  (2-3) | [2-3] | (3-3) | (3-1) | (3-2) | (1-2) |
| | 4-3 | 4-3  (3-3) | (4-3) | [3-3] | (3-1) | (3-2) | (1-2) |
| | 5-3 | 5-3  (3-1) | (4-3) | (5-3) | [3-1] | (3-2) | (1-2) |
| NEGATIVE | 5-4 | 5-4  (3-2) | (4-3) | (5-3) | (5-4) | [3-2] | (1-2) |
| | 4-4 | (4-3)  (5-3) | [4-3] | [5-3] | (5-4) | 4-4 | (1-2) |
| | 3-4 | 4-4  (5-4) | 3-4 | [5-4] | (4-4) | | (1-2) |
| | 2-4 | 3-4  (4-4) | (3-4) | 2-4 | | [4-4] | (1-2) |
| | 1-4 | 1-4  (1-2) | (3-4) | 2-4 | (1-4) | | [1-2] |

PATTERN COMPARISON METHOD AND APPEARANCE INSPECTION MACHINE FOR PERFORMANCE COMPARISON BASED ON DOUBLE DETECTION WITHOUT DELAY

CROSS-REFERENCE TO RELATED APPLICATION

This application claims priority of Japanese Patent Application No. 10-30715, filed on Oct. 28, 1998.

BACKGROUND OF THE INVENTION

1. Field of the Invention

The present invention relates to a pattern checking technology, for example, a technology that will prove effective when implemented in an inspection of a semiconductor wafer or liquid crystal display device for defects.

2. Description of the Related Art

Generally, a semiconductor manufacturing process includes 300 to about 500 steps. If a defect occurred at each step, numerous defects would be found at the last step. For improving the yield of a product, each pattern should ideally be inspected at each step. This is however unfeasible in terms of expense and labor. In reality, pattern inspection is performed at only some of the steps. For better efficiency in manufacturing, pattern inspection should preferably be performed as a step of a manufacturing process. This necessitates a high-precision appearance inspection machine capable of inspecting patterns at a rate matching the progress of a manufacturing process.

A semiconductor wafer can be divided into an array of dice, each die etched with a pattern. According to the prior art, any of the dice arrayed on the same row or column except dice located at both ends of the row or column (hereinafter, referred to as marginal dice) can be inspected highly precisely according to double detection. Specifically, the dice are each compared with two adjacent dice to be scanned during each scan. However, the marginal dice can merely be inspected for a defect according to single detection because there is no die on one side of the marginal dice. According to the prior art, low-reliability inspection must be permitted for the marginal dice. Otherwise, the marginal dice are not inspected for a defect at all. According to another method, after the whole surface of an object is inspected, parts in which a defect candidate is detected by performing single detection are scanned again in order to be imaged. The marginal dice are compared with the third outermost dice, thereby checking if a defect candidate is present on the marginal dice. According to this method, however, the same patterns must be imaged again for extra comparison. If numerous defect candidates are found on the marginal dice, efficiency in detection is quite poor.

According to another conceivable method, images of the marginal dice to be scanned first and last, and images of the third outermost dice are stored in a storage unit such as memory or the like. Every time each scan is completed, images are read from the image storage unit for comparison. In this case, the third die is compared three times with the first die, second die, and fourth die respectively. Efficiency in detection is therefore very poor.

A comparison unit included in a pattern comparison system has generally the minimum-level ability to process acquired images without delay in consideration of the total cost of a system. For this reason, extra comparisons will lower an inspection rate.

Moreover, according to a method described in Japanese Unexamined Patent Publication No. 2-210249, the trailing die on each scanned row or column is compared with the leading die on the next row or column, and marginal dice are thus inspected according to double detection. According to this method, since a scanning direction in which a row or column is scanned is different between the first row or column and second row or column, the image of the trailing die on the first row or column stored in a buffer memory must be read inversely.

However, the method described in the Japanese Unexamined Patent Publication No. 2-210249 poses a problem. Specifically, since images of marginal dice acquired by scanning different rows or columns in different directions are compared with each other, the results of comparison are affected by the direction-dependent characteristic of a line sensor employed for pattern comparison or the direction-dependent characteristic of an xy stage. In particular, a TDI sensor for outputting a one-dimensional image can, similarly to a simple line sensor, scan dice in both positive and negative directions. Generally, the output-related characteristic of the TDI sensor is different between the positive and negative directions. Electric signals produced by the TDI sensor must therefore be corrected by referencing different look-up tables associated with scanning directions.

Normally, if the pixels contain some errors stemming from correction of data acquired by scanning the dice in the same scanning direction, the errors are canceled out during comparison. The errors will therefore not become a factor of deteriorating a signal-to-noise ratio permitted for inspection by the pattern comparison system. However, if the marginal dice of different rows are compared with each other, images produced by scanning the dice in different directions are compared with each other. If the data of the images contain correction errors, the signal-to-noise ratio will deteriorate. For this reason, images produced by scanning dice in the same direction should preferably be compared with each other.

In the prior art, a detection method for comparing patterns of two or more adjacent dice with one another according to double detection has been widely adopted for a pattern comparison system for semiconductor wafers or the like.

SUMMARY OF THE INVENTION

Accordingly, an object of the present invention is to provide a pattern inspection technology and, for example, a novel method of comparing patterns on a semiconductor wafer or liquid crystal display. Namely, every die including marginal dice is compared with others with high precision and without delay according to double detection.

To accomplish the above object, according to the present invention, there is provided a pattern comparison method based on double detection. According to the double detection, images of areas of a plurality of identical patterns arrayed in rows or columns on an inspected object are produced and each compared with images of two or more nearby areas. A defect in a pattern is detected based on the comparison results. According to the pattern comparison method, double detection is performed in high precision on all dice including marginal dice without delay. Acquired images of the inspected object are stored temporarily. Stored images are read and compared with each other while the sequence of images to be compared is varied so that the amount of memory to be prepared for image storage will be as small as possible. Images of areas, except marginal areas to be scanned first and last, are compared with images of adjacent areas which are produced by scanning the same row of dice in the same direction. Images of the marginal areas to be scanned first and last are compared with images of areas adjacent one side of the marginal areas that are produced by scanning the same row of dice in the same direction. The images of the marginal areas are also compared with images of nearby areas which are produced by scanning a continued different row of dice in the same direction in consideration of minute inhomogeneity in the characteristic distribution on a semiconductor wafer.

Moreover, according to an aspect of the present invention in which the method is implemented, there is provided a pattern comparison system including an image acquisition unit, an image storage unit, an image comparison unit, and a defect detecting means. The image acquisition unit is an optical unit movable relatively in the directions of rows or columns on an inspected object. Images of at least four dice acquired by the optical image acquisition unit can be stored in the image storage unit. An image serving as an object of comparison can be retrieved from among the stored images and read from the storage unit. The image comparison unit compares two images with each other. The defect detecting means detects defects in the inspected object according to the results of comparison of images of areas performed by the image comparison unit.

According to the present invention, although a pattern comparison method providing the same throughput for image acquisition and image comparison is adopted, efficiency in inspection achieved by comparing patterns with each other, sensitivity for inspection, and an inspection rate can be improved. This is because images acquired by scanning dice in the same direction can be used to compare every die including marginal dice with others substantially without delay according to double detection. Moreover, images of the marginal dice acquired by scanning dice in the same direction are compared with each other. Deterioration in a signal-to-noise ratio due to a correction error can therefore be suppressed.

BRIEF DESCRIPTION OF THE DRAWINGS

The present invention will be more clearly understood from the description as set below with reference to the accompanying drawings, wherein:

FIG. 4 shows the procedures of image acquisition, image comparison, and image storage according to the embodiment of the present invention.

DETAILED DESCRIPTION OF THE PREFERRED EMBODIMENTS

Before proceeding to a detailed description of the preferred embodiments, the prior art will be described with reference to the accompanying drawings relating thereto for a clearer understanding of the differences between the prior art and the present invention.

Figure 1:
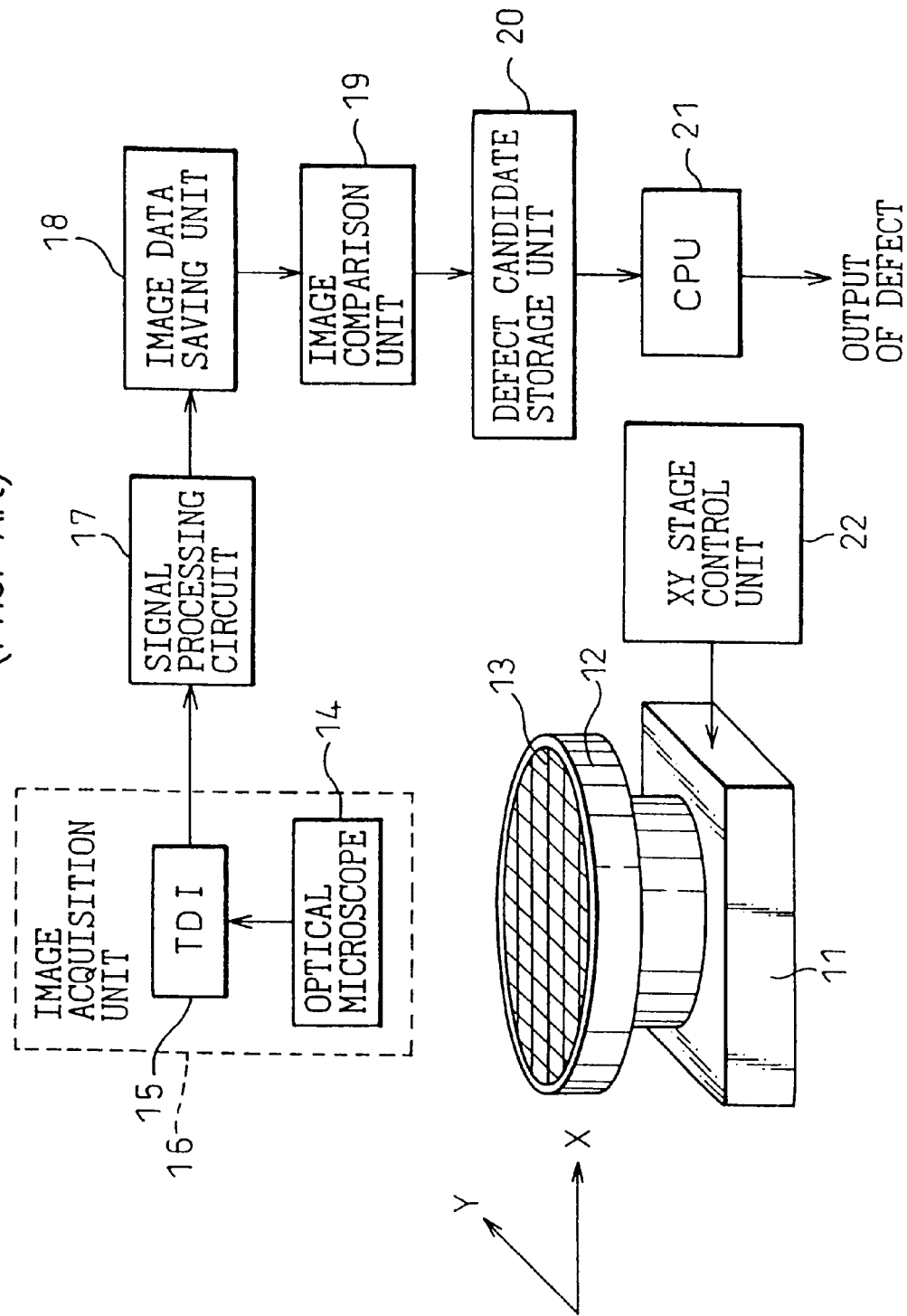
FIG. 1 shows a pattern comparison system for semiconductor wafers in which a detection method based on double detection is implemented according to the prior art.

FIG. 1 shows an alternate pattern comparison system for semiconductor wafers in which a detection method based on double detection is implemented. A semiconductor wafer 13 is placed on a sample holder 12 mounted on an xy stage 11. The xy stage 11 is moved by an xy stage control unit 22. An image acquisition unit 16 composed of an optical microscope 14 and an imaging device 15 such as a TDI sensor successively acquires images of the surface of the semiconductor wafer 13 to be scanned continuously in the x directions. The TDI sensor is made by assembling one-dimensional line sensors (CCD line sensors) on numerous stages. Signal charges accumulated on CCD devices of the line sensors on the stages are successively transferred to the CCD devices on the next stages at the same rate as a scanning rate. Signal charges at the point of identical mapping symmetry can be superimposed by the plurality of CCD devices. Acquired image signals are successively multi-valued by a signal processing circuit 17. The coded data is stored in an image data saving unit 18 such as a memory.

Images of corresponding areas in adjacent dice on the semiconductor wafer 13, for example, first and second dice, are acquired. Along with the acquisition, the image comparison unit 19 arithmetically aligns the two images with each other in units of a pixel or smaller for each frame. Gray levels specified in corresponding pixels are compared with each other. If a difference between gray levels specified in corresponding pixels exceeds a predetermined reference value, it is judged that either the first die or second die is defective. A difference between the images of the first die and second die is binary-coded and preserved as a defect candidate in a defect candidate storage unit 20. After single detection is completed, it is uncertain whether the defect candidate stems from the second die or first die on the semiconductor wafer.

Acquiring an image of the third die is then started. Gray levels specified in corresponding pixels are compared with each other between the second die and third die according to the above procedure. If a difference between the gray levels specified in the corresponding pixels exceeds the predetermined reference value, it is judged that either the second die or third die is defective. A difference between the images of the second die and third die is binary-coded as a defect candidate. The difference image is collated with the difference image between the first die and second die which is preserved in the defect candidate storage unit 20. If the defect candidates contain the same pixel, the CPU 21 judges that the second die is defective.

As mentioned above, the detection method based on double detection is such that the same defect is detected twice by comparing two pairs of adjacent dice with each other. The detection method has the advantage that a defective die can be located and reliability in the results of detection improves. The aforesaid operation is performed on all dice continuously without delay, whereby patterns are compared with one another.

Figure 2:
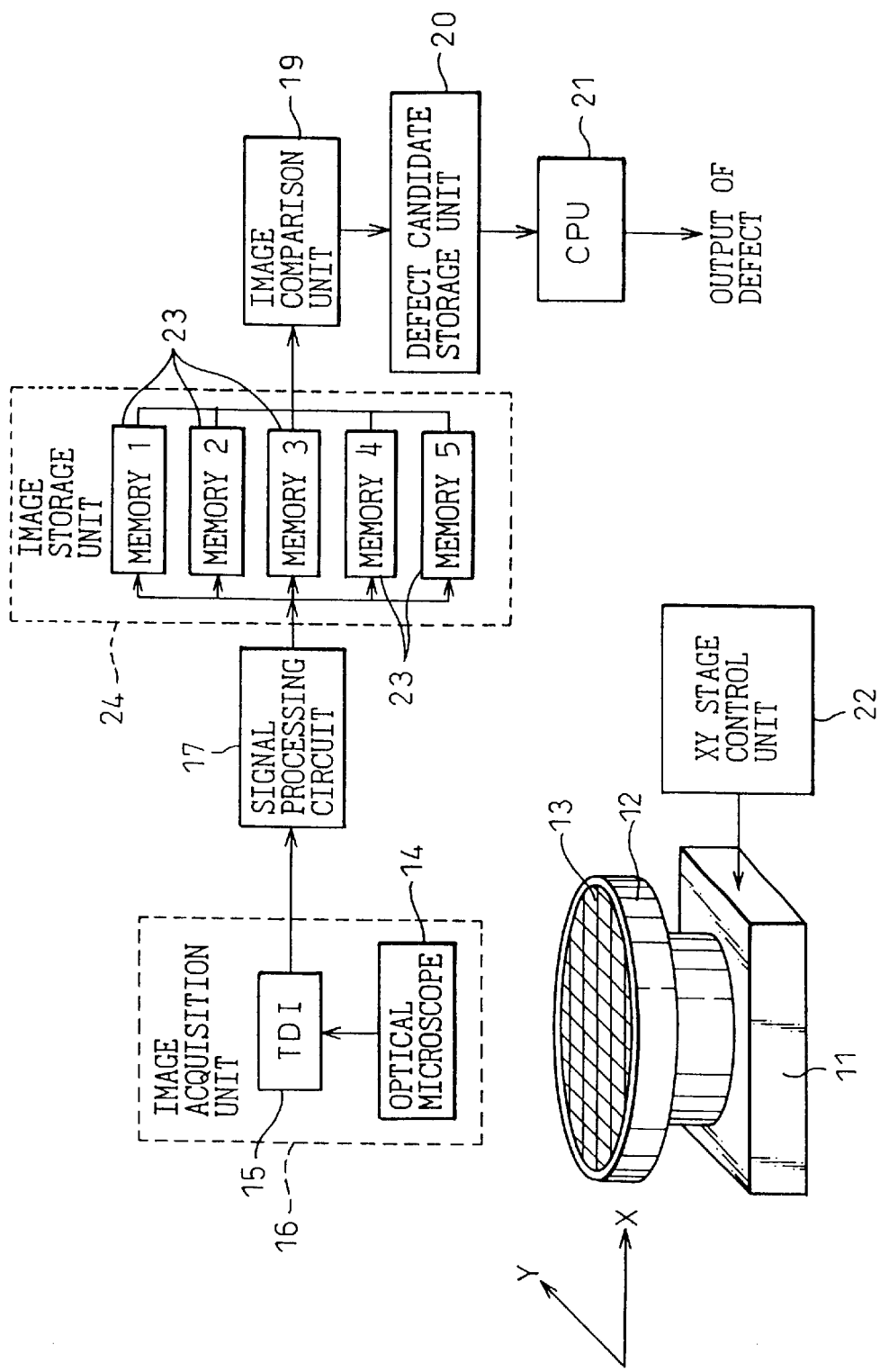
FIG. 2 shows a pattern comparison system for semiconductor wafers in which a detection method based on double detection is implemented according to an embodiment of the present invention.

FIG. 2 shows a pattern comparison system for semiconductor wafers in which the detection method based on double detection according to an embodiment of the present invention is implemented. A semiconductor wafer 13 is placed on a sample holder 12 mounted on an xy stage 11. The xy stage 11 is moved by an xy stage control unit 22. Dice arrayed on the semiconductor wafer 13 are scanned in units of a scanned width in a combination of positive and negative directions. Acquired image signals are successively multi-valued by a signal processing circuit 17.

Figure 3:
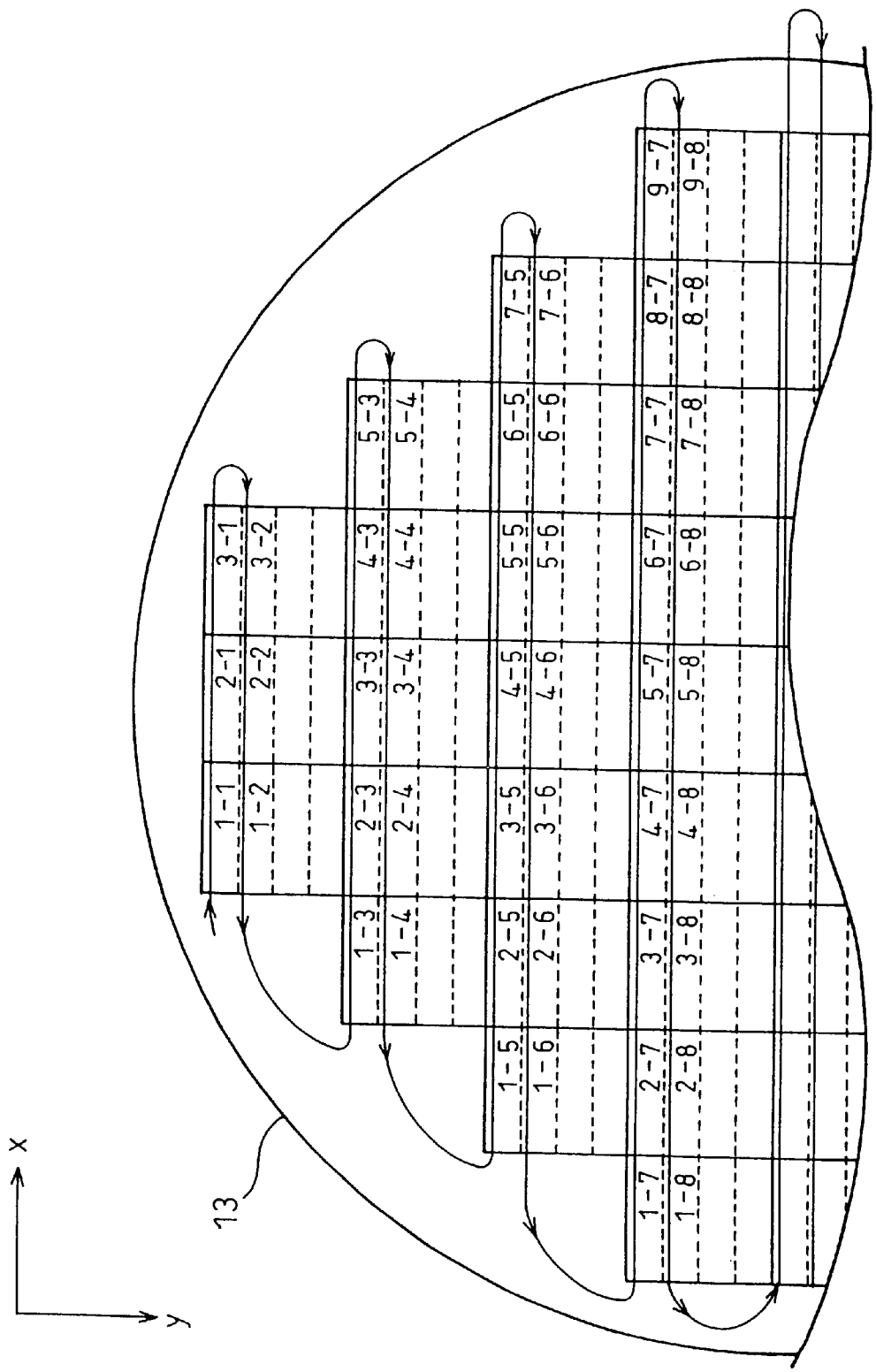
FIG. 3 shows a trajectory along which a TDI sensor scans a semiconductor wafer according to the embodiment of the present invention.

FIG. 3 shows a trajectory along which a semiconductor wafer is scanned by a TDI sensor according to the embodiment of the present invention. For brevity's sake, a number is assigned to each of the areas whose images are acquired. Moreover, dice are arrayed on even-numbered rows. When each die is scanned in units of the scanned width, each die is divided into an even number of areas. The dice are scanned in the direction of an arrow in FIG. 3 successively from the first die of the first row. Namely, areas 1-1, 2-1, and 3-1 are scanned in that order in the x-axis positive direction. When the last die of the first row has been scanned, the xy stage is moved by the scanned width in the y-axis positive direction. Areas 3-2, 2-2, and 1-2 are then scanned in that order in the x-axis negative direction. When acquiring images from two lines of areas on the first row of dice are completed, the second row of dice is scanned started with the leading die. Namely, areas 1-3, 2-3, 3-3, 4-3, and 5-3 are scanned in that order. This operation is performed on all rows of dice. After the last row of dice is scanned, subsequent areas on the first row of dice are scanned in the same manner. Consequently, the whole surface of the wafer is scanned.

Along with the foregoing scan, acquired images of adjacent dice are compared with each other. An included image comparison unit must be able to compare images of at least two dice with each other while the image acquisition unit acquires an image of one die. Otherwise, an action of suspension or the like must be inserted to the foregoing operation. Consequently, the throughput of the whole system deteriorates.

According to the present invention, acquired images are temporarily stored in an image storage unit 24 having memories 23. This is intended to highly precisely perform double detection on all dice including marginal dice without deterioration of throughput. The sequence of images to be compared is modified so that the number of memories 23 to be prepared in the memory storage unit 24 will be as small as possible. Meanwhile, images are read from the image storage unit 24 and compared with each other. In other words, images of areas other than marginal areas to be scanned first and last are compared with images of adjacent areas which are produced by scanning the same row of dice in the same direction. The images of the marginal areas to be scanned first and last are compared with images of areas adjacent one side of the marginal areas which are produced by scanning the same row of dice in the same direction. In consideration of minute inhomogeneity in the characteristic distribution on the semiconductor wafer, the images of the marginal areas to be scanned first and last are compared with images of another nearby areas which are produced by scanning a different row of dice in the same direction.

FIG. 4 shows the procedures of image acquisition, image comparison, and image storage in accordance with the embodiment of the present invention by utilizing numerals assigned to the areas in the dice shown in FIG. 3. FIG. 4 lists scanning directions in which the image acquisition unit 16 scans dice, areas whose images are acquired thereby, pairs of areas whose images are compared with each other by the image comparison unit 19, and areas whose images are stored in the image storage unit 24. Moreover, areas whose images have been compared with others once are encircled with a circle, while areas whose images have been compared with others twice are encircled with a square.

In reality, the images of the areas 1-2, 2-1, 3-1, etc. are each divided into frames and read from the image comparison unit. The image comparison unit compares an image of each area with another in units of a frame.

Referring to FIGS. 2, 3, and 4, the procedures of image acquisition, image comparison, and image storage in accordance with the embodiment will be described below.

First, the image acquisition unit 16 acquires an image of area 1-1 on the first row shown in FIG. 3 by scanning the area in the x-axis positive direction. Meanwhile, an image of another die to be compared with the image does not exist in the image storage unit 24. The image comparison unit 19 does not therefore carry out comparison for the meantime. The image of area 1-1 remains stored in the memory 23 in the image storage unit 24.

Thereafter, the image acquisition unit 16 starts acquiring an image of area 2-1 in the second die on the first row. The image of area 2-1 is compared with the image of area 1-1 stored in the image storage unit 24 by the image comparison unit 19, and then stored in the image storage unit 24.

If a difference in gray level between the images of areas 2-1 and 1-1 exceeds a certain reference value, it is judged that either the area 2-1 or area 1-1 is defective. A difference between the S images of areas 2-1 and 1-1 is binary-coded and stored as a defect candidate in the defect candidate storage unit 20.

Thereafter, the image acquisition unit 16 starts acquiring an image of area 3-1 in the third die on the first row. The image comparison unit 19 compares the acquired image of area 3-1 with the image of area 2-1 stored in the image storage unit 24. At this time, the image of area 2-1 has been compared with the images of two adjoining dice according to double detection. The image is therefore deleted from the image storage unit 24.

If a difference in gray level between the images of areas 3-1 and 2-1 exceeds the certain reference value, it is judged that either area 3-1 or area 2-1 is defective. A difference between the images of areas 3-1 and 2-1 is binary-coded as a defect candidate. The difference image is collated with the difference image between areas 2-1 and 1-1 that has already been stored in the defect candidate storage unit 20. If the defect candidates contain the same pixel, the CPU 21 judges that the pixel location of area 2-1 is defective.

Thereafter, the xy stage 11 is moved to be displaced in the y-axis positive direction by the scanned width. When scanning in the x-axis negative direction is started, the image acquisition unit 16 restarts acquisition of an image of area 3-2. However, an image to be compared with the image of area 3-2 does not exist in the image storage unit 24 yet. The image comparison unit 19 does not therefore carry out comparison for the meantime. The image of area 3-2 remains stored in the image storage unit 24.

Thereafter, the image acquisition unit 16 starts acquiring an image of area 2-2 in the second die on the first row. The image of area 2-2 is then compared with the image of area 3-2 stored in the image storage unit 24 by the image comparison unit 19, and is then stored in the image storage unit 24.

Furthermore, the image acquisition unit 16 starts acquiring an image of area 1-2 in the first die on the first row. The acquired image of area 1-2 is then compared with the image of area 2-2 stored in the image storage unit 24 by the image comparison unit 19, and then stored in the image storage unit 24. At this time, the image of area 2-2 has been compared with the images of two adjacent dice according to double detection. The image of area 2-2 is therefore deleted from the image storage unit 24.

When scanning the first row of dice in the x-axis positive and negative directions has been completed, four images of areas 1-1, 3-2, 3-1, and 1-2 remain stored in the memory 23 in the image storage unit 24. These four images have been compared with others only once (single detection).

Thereafter, scanning the second row of dice in the x-axis positive direction is started. The image acquisition unit 16 starts acquiring an image of area 1-3. The acquired image of area 1-3 is compared with the image of area 1-1 in the nearest marginal die by the image comparison unit 19. Area 1-1 is selected from among the areas whose images are stored in the image storage unit 24. This is because area 1-1 has been scanned in the same x-axis positive direction as area 1-3, and the characteristic distribution on a semiconductor wafer is minutely inhomogeneous. When the comparison is completed, the image of area 1-1 has been compared with the images of area 2-1 and area 1-3 according to double detection.

The foregoing scanning and comparison are carried on as shown in FIG. 4. The image acquisition unit 16 starts acquiring an image of area 5-3. The acquired image of area 5-3 is then compared with the image of area 3-1 by the image comparison unit 19, and then stored in the image storage unit 24. Area 3-1 is selected from among the areas whose images are stored in the image storage unit 24 because area 3-1 has been scanned in the same x-axis positive direction as area 5-3. Thus, comparing the image of area 3-1 with others according to double detection is completed. Among the areas whose images are stored in the image storage unit, area 4-3 and area 3-1 have been scanned in the same x-axis positive direction as area 5-3. Area 3-1 is selected as an area whose image is to be compared with the image of area 5-3 from areas 4-3 and 3-1. This is because unless the image of area 3-1 is compared with the image of area 5-3 at that time, it will not be compared with any image of a nearby area.

Thereafter, the xy stage 11 is moved to be displaced by the scanned width in the y-axis positive direction. The image acquisition unit 16 starts acquiring an image of area 5-4 by scanning the area in the x-axis negative direction. The image of area 5-4 is compared with the image of area 3-2 by the image comparison unit 19, and then stored in the image storage unit 24. Area 5-4 is selected from among the areas whose images are stored in the image storage unit 24 because area 5-4 has been scanned in the same x-axis negative direction as area 3-2 and is located in the marginal die nearest to area 3-2. Thus, the image of area 3-2 has been compared with others according to double detection.

Thereafter, the image acquisition unit 16 starts acquiring an image of area 4-4. The image of area 4-4 is merely stored in the image storage unit 24. The image comparison unit 19 compares the images of areas 4-3 and 5-3 with each other. Areas 4-3 and 5-3 are selected from among the areas whose images are stored in the image storage unit 24, because they have been scanned in the same x-axis positive direction. Thus, the images of area 4-3 and 5-3 have been compared with others according to double detection, and are then deleted from the memory 23 in the image storage unit 24. Among the areas whose images are stored in the image storage unit 24, area 4-4 is not selected but areas 4-3 and 5-3 are selected so that the images of the areas will be compared with each other. This is because the number of memories 23 prepared in the image storage unit 24 is made as small as possible.

Thereafter, the image acquisition unit 16 starts acquiring an image of area 3-4. The acquired image of area 3-4 is merely stored in the image storage unit 24. The image comparison unit 19 compares the images of area 4-4 and area 5-4 with each other. Areas 4-4 and 5-4 are selected from among the areas whose images are stored in the image storage unit 24, because areas 4-4 and 5-4 have been scanned in the same x-axis negative direction as each other. Thus, the image of area 5-4 has been compared with others according to double detection.

Thereafter, the image acquisition unit 16 starts acquiring an image of area 2-4. The acquired image of area 2-4 is merely stored in the image storage unit 24. The images of area 3-4 and area 4-4 stored in the image storage unit 24 are compared with each other by the image comparison unit 19. Thus, the image of area 4-4 has been compared with others according to double detection.

Furthermore, the image acquisition unit 16 starts acquiring an image of area 1-4. The acquired image of area 1-4 is compared with the image of area 1-2 by the image comparison unit 19 and stored in the image storage unit 24. Area 1-2 is selected from among the areas whose images are stored in the image storage unit 24, because area 1-2 has been scanned in the same x-axis negative direction as area 1-4. Thus, the image of area 1-2 has been compared with the images of two adjacent dice according to double detection, and is then deleted from the image storage unit.

When acquiring images from one row of dice by scanning the dice in two directions of the x-axis positive and negative directions is completed, three images of areas 3-4 (single detection), 1-4 (single detection), and 2-4 (not compared at all) remain intact in the memory 23 in the image storage unit 24. When images of remaining areas are first acquired by scanning the areas in the positive and negative directions, the images of areas 3-4, 1-4, and 2-4 are compared with one another. For example, when the images of areas 1-1 and 3-2 in the dice on the first row are acquired, the images are compared with one another. No delay will be produced at this time.

Comparison is repeated according to the foregoing procedure. The comparison can be achieved without any delay during scanning. When the images of all areas in all dice have been acquired, two image comparisons are still not completed. Taking the time required for scanning the widths of two dice completes the comparisons. Influence of the time on the total inspection time can therefore be ignored.

Moreover, it is apparent from FIG. 4 that the image storage unit 24 in which acquired images of areas are stored needs five memories. Newly acquired images of areas can be stored in a memory from which images having been compared with others according to double detection are deleted. Only four memories should be prepared. The memories have multi-port memories or the like. Moreover, in this embodiment, the TDI sensor 15 is installed to scan dice in the x-axis directions that are regarded as scanning directions. The TDI sensor 15 reads an image of the surface of the semiconductor wafer 13 while the xy stage 11 is moved in the x-axis directions. Alternatively, the TDI sensor 15 may be moved instead of the xy stage 11. Furthermore, in this embodiment, the TDI sensor 15 is adopted as an imaging means. The present invention is not limited to this mode. An ordinary one-dimensional sensor such as a CCD line sensor will do.

The embodiment has been described on the assumption that dice are arrayed in even-numbered rows. Moreover, when each die is scanned in units of a scanned width, the die is divided into even-numbered areas. Alternatively, the number of rows of dice may be odd and the number of areas into which each die is divided may be odd. This will be mentioned below.

The inventor has disclosed a technology for comparing dice with one another within one row of dice, which includes three or more dice, without delay in Japanese Unexamined Patent Publication No. 10-145806. When the number of rows of dice is odd, the technology should be implemented in scanning of the first row and last row of dice.

Moreover, when each die is scanned in units of the scanned width, the die may be divided into an odd number of areas. In this case, for example, after the unmated areas of the first die to the last die on each row are scanned, the xy stage is moved quickly in the negative direction. The unmated areas on the next row of dice are then scanned in the positive direction. Dice are scanned in the positive direction in order to read images thereof. Dice except marginal dice are compared with adjacent dice. The marginal dice are primarily compared with the nearby marginal dice on different rows, and secondly compared with adjoining dice. If deterioration in throughput due to return of the xy stage to one side is serious, unmated areas in dice on one row may be mated with unmated areas in dice on the next row. The areas on one row and the next row are then scanned in the positive and negative directions respectively. The acquired images of the areas may be compared with images acquired by scanning the next two rows of dice in the positive and negative directions respectively. Otherwise, the technology disclosed in the Japanese Unexamined Patent Publication No. 10-145806 may be adopted. Thus, the throughput of the system will not be impaired.

As described so far, according to the present invention, even a pattern comparison system providing the same throughput for image acquisition and image comparison can compare all dice including marginal dice with one another according to double detection without delay by utilizing images acquired by scanning the dice in the same direction. Consequently, efficiency in inspection to be performed by comparing patterns, sensitivity in inspection, and an inspection rate can be improved. Moreover, images of marginal dice acquired by scanning dice in the same direction are compared with each other. A decrease in a signal-to-noise ratio due to a correction error can be suppressed.

What is claimed is:

1. A pattern comparison method based on double detection according to which images of areas in a plurality of identical patterns arrayed in rows and columns on an inspected object are produced and each compared with other images of two or more nearby areas, and defects are detected based on the results of comparison, said pattern comparison method comprising:

a step of relatively scanning said inspected object in a combination of positive and negative directions along the rows or columns so as to produce images of said areas on said inspected object;

a step of temporarily storing the produced images of said areas; and a step of comparing the stored image of each area with the other stored images of two or more nearby areas concurrently with said step of scanning, wherein at said step of comparing, images of areas except marginal areas to be scanned first and last are compared with images of adjacent areas produced by scanning the same row as the areas scanned to produce the images of areas and in the same direction used to scan the areas, and wherein images of the marginal areas to be scanned first and last are compared with images of areas adjacent to sides of the marginal areas which have been produced by scanning the same row as the marginal areas scanned to produce the images of marginal areas and in the same direction used to scan the marginal areas; and the images of the marginal areas are also compared with other images of nearby areas produced by scanning a different row from the marginal areas scanned to produce the images of the marginal areas and in the same direction used to scan the marginal areas.

2. A pattern comparison method according to claim 1, wherein at said step of scanning, all the dice on said inspected object are scanned to be imaged.

3. A pattern comparison method according to claim 1, wherein, at said step of scanning, the surface of said inspected object is segmented into rectangular areas, and the rectangular areas are scanned to be imaged.

4. An appearance inspection machine based on double detection according to which images of areas in a plurality of identical patterns arrayed in rows and columns on an inspected object are produced and each compared with other images of two or more nearby areas, and defects in said patterns are detected based on the results of comparison, said appearance inspection machine comprising:

a means for relatively scanning said inspected object in a combination of positive and negative directions along the rows or columns so as to produce images of said areas on said inspected object;

a means for temporarily storing the produced images of said areas; and a means for comparing the stored image of each area with the other images of two or more nearby areas, wherein said comparing means compares images of areas except marginal areas to be scanned first and last with images of adjacent areas produced by scanning the same row as the areas scanned to produce the images of areas and in the same direction used to scan the areas, and wherein images of the marginal areas to be scanned first and last are compared with images of areas adjacent to sides of the marginal areas which have been produced by scanning the same row as the marginal areas scanned to produce the images of the marginal areas and in the same direction used to scan the marginal areas; and the images of the marginal areas are also compared with the other images of nearby areas produced by scanning a different row from the marginal areas scanned to produce the images of the marginal areas and in the same direction used to scan the marginal areas.

5. An appearance inspection machine according to claim 4, wherein said scanning means includes a TDI sensor.

6. An appearance inspection machine according to claim 4, wherein said storing means includes memories in which images of at least four dice can be stored.

* * * * *

UNITED STATES PATENT AND TRADEMARK OFFICE
CERTIFICATE OF CORRECTION

PATENT NO. : 6,512,843 B1
DATED : January 28, 2003
INVENTOR(S) : Masayuki Kuwabara It is certified that error appears in the above-identified patent and that said Letters Patent is hereby corrected as shown below:

<u>Title page, Item [54] and Column 1, line 3,</u>
Title, replace "PERFORMANCE" with -- PERFORMING --

<u>Title page,</u>
Item [75], Inventor, replace "Machida" with -- Machida-shi --

<u>Column 10,</u>
Line 6, add the word -- the -- between "with" and "other"
Line 11, replace "dice" with -- areas --

Signed and Sealed this

Twenty-second Day of June, 2004

JON W. DUDAS
*Acting Director of the United States Patent and Trademark Office*